United States Patent
Dietrich et al.

(10) Patent No.: US 6,716,721 B2
(45) Date of Patent: Apr. 6, 2004

(54) METHOD FOR MANUFACTURING A SILICON WAFER

(75) Inventors: Harry Dietrich, Kirchardt (DE); Volker Dudek, Korntal-Muenchingen (DE); Andreas Schueppen, Lauffen (DE)

(73) Assignee: Atmel Germany GmbH, Heilbronn (DE)

(*) Notice: Subject to any disclaimer, the term of this patent is extended or adjusted under 35 U.S.C. 154(b) by 0 days.

(21) Appl. No.: 10/145,169

(22) Filed: May 13, 2002

(65) Prior Publication Data

US 2002/0173119 A1 Nov. 21, 2002

(30) Foreign Application Priority Data

May 16, 2001 (DE) .......................................... 101 24 030

(51) Int. Cl.$^7$ ................................................ H01L 21/30
(52) U.S. Cl. .................................................... 438/455
(58) Field of Search ................................ 438/455, 457, 438/458, 459, 461, 462, 689, 406

(56) References Cited

U.S. PATENT DOCUMENTS

| | | | |
|---|---|---|---|
| 3,974,006 A | * 8/1976 | Rodriguez | 29/580 |
| 5,234,535 A | 8/1993 | Beyer et al. | |
| 5,453,394 A | 9/1995 | Yonehara et al. | |
| 5,583,059 A | 12/1996 | Burghartz | |
| 5,821,149 A | 10/1998 | Schueppen et al. | |
| 5,882,987 A | 3/1999 | Srikrishnan | |
| 6,057,212 A | * 5/2000 | Chan et al. | 438/455 |
| 6,091,112 A | 7/2000 | Kwon | |
| 6,103,009 A | 8/2000 | Atoji | |
| 6,146,979 A | * 11/2000 | Henley et al. | 438/458 |
| 6,197,695 B1 | 3/2001 | Joly et al. | |
| 6,413,874 B1 | * 7/2002 | Sato | 438/714 |
| 2002/0173086 A1 | 11/2002 | Dietrich et al. | |
| 2002/0173118 A1 | 11/2002 | Dietrich et al. | |

FOREIGN PATENT DOCUMENTS

| | | |
|---|---|---|
| DE | 2535813 | 11/1976 |
| DE | 19609933 | 9/1997 |
| DE | 19757269 | 7/1998 |
| EP | 0996150 | 4/2000 |
| EP | 1045448 | 10/2000 |

OTHER PUBLICATIONS

H. S. Gamble; "Polish Stop Technology for Silicon on Silicide on Insulator Structures" by H. S. Gamble; Perspectives, Science and Technologies for Novel Silicon on Insulator Devices, 2000, pp. 17 to 28.

S. B. Goody, "High Speed Bipolar on Bonded Buried Silicide SOI (S$^2$OI)", ESSDERC, 1998, pp. 500 to 503.

Witek P. Maszara, "SOI by Wafer Bonding: A Review"; Electrochem. Soc. PV 90–6; 1990; pp. 199 to 212B.

* cited by examiner

*Primary Examiner*—David Nelms
*Assistant Examiner*—Thao P. Le
(74) *Attorney, Agent, or Firm*—W. F. Fasse; W. G. Fasse

(57) ABSTRACT

In a method for manufacturing a silicon wafer with an insulating intermediate layer, the surface of a first wafer, which has an insulating intermediate layer, is bonded to the surface of a second wafer, and then the substrate layer and the insulating intermediate layer of the fist wafer are removed. The new silicon surface created in this manner has a high layer quality which is achieved at a low cost.

20 Claims, 1 Drawing Sheet

METHOD FOR MANUFACTURING A SILICON WAFER

CROSS-REFERENCE TO RELATED APPLICATIONS

This application is related to U.S. applications Ser. Nos. 10/145,013 and 10/145,172, both filed on May 13, 2002.

BACKGROUND

1. Field of the Invention

The present invention relates to a method for manufacturing a silicon wafer with an insulating intermediate layer.

2. Description of the Related Technology

Such a method for manufacturing a silicon wafer with an oxide layer as an insulating intermediate layer, hereinafter referred to as an SOI wafer is known from the publication EP 1 045 448 A. In the method described, which is also known as "SMART CUT", a first silicon wafer is oxidized and then a hydrogen-rich layer is created by means of a hydrogen implantation in a depth defined by the implantation energy. The surface of the first wafer is then bonded to the surface of a second wafer, thus creating a buried insulating intermediate layer of oxide. A subsequent temperature step causes bubble formation in the hydrogen-rich layer which blows off the greater part of the first wafer. In order to achieve a surface or layer quality for the manufacture of integrated circuits, the new surface of the Sol wafer is freed by means of further process steps to the greatest possible extent from the contaminations and defects which the blowing off has caused in the layer near to the surface. The thicknesses of the silicon layer lying on the oxide layer which can be achieved with the method lie in the range of 1.0 $\mu$m and are largely determined by the maximum penetration depth which the hydrogen ions can achieve during the implantation.

In other known methods, described for example in the publication W. P. Maszara, Electrochem. Soc. PV 90-6, 199–212 B (1990), SOI wafers are manufactured by reducing either the rear side of the first or the rear side of the second wafer to the desired layer thickness, which is usually more than a few $\mu$m, by thinning, or cutting and thinning, after the oxidation and the bonding of the surface of the first wafer to the surface of the second wafer.

The disadvantage of the previous methods is that great expenditure is required to improve the surface and/or the layer quality of the silicon layer lying on the insulating oxide. In particular, the blowing off in the SMART-CUT method causes an exceptionally large amount of crystal damage in the surface of the wafer, which is reduced by means of subsequent process steps, such as for example chemical-mechanical polishing or reduction processes. As a result of the manner of manufacture with the other methods, the cleaning of the surface and the checking of the layer parameters, such as the evenness of the layer thickness, and the production of reproducible final thicknesses is also very time-consuming. Furthermore, buried layers or vertical gradients in the layer parameters, especially in the case of layer thicknesses greater than 2 $\mu$m, cannot be manufactured with acceptable expenditure.

As the quality of the silicon layer is an important prerequisite for ensuring an acceptable yield in the manufacture of integrated circuits in the field of silicon technology, particularly in the field of manufacturing integrated circuits, it is an object of the development to provide methods which create a particularly high layer quality, i.e. evenness and freedom from defects, for silicon wafers with an insulating intermediate layer with acceptable expenditure. Furthermore, it is desirable to be able to easily adapt parameters, such as the conductivity, within the upper silicon layer even for thicker silicon layers.

SUMMARY OF THE INVENTION

The object of the present invention is to provide a method with which parameters of the surface layer of an SOI wafer can be easily adapted.

This object has been achieved according to the invention in a method for fabricating a manufactured multi-layered silicon wafer by bonding together a first silicon wafer and a second silicon wafer.

According to this, starting from a wafer that has an insulating intermediate layer, the essence of the invention lies in obtaining the silicon boundary surface of the silicon/ oxide boundary layer of the first silicon layer as the new silicon surface. For this purpose, a silicon wafer with an insulating intermediate layer is created, starting from a first silicon wafer comprising a surface layer on top of an insulating intermediate layer arranged on a substrate and a second silicon wafer with a surface, by bonding the respective surfaces of the two wafers and, before bonding, at least one insulating layer is applied to the surface of at least one silicon wafer, and the substrate of the first silicon wafer is removed after bonding.

In so doing, it is advantageous to remove the substrate of the first silicon wafer selectively with regard to the insulating intermediate layer, as selective removal can be performed by robust and comparably inexpensive process steps, such as for example by a wet chemical process. In a subsequent process step, the previous boundary surface of the silicon/insulating layers, which was buried before the bonding, is made available as a new silicon surface by removing the insulating intermediate layer of the first wafer.

The advantage of the new method in comparison to the previous state-of-the-art is that the surface of the first silicon layer is made available with higher quality for further production processes, such as for example the manufacture of integrated circuits, without requiring after-treatment of the uppermost silicon layer. The method does not depend upon the thickness of the first layer of the first silicon wafer. Particularly in the case of thicker layers, the demands upon the quality of the surface of the first wafer, such as for example the evenness of the layer thickness, are substantially reduced as an insulating layer is deposited on the surface, and the previous surface is buried by bonding with another wafer, and becomes the boundary surface between the silicon/insulating layers. The demands upon the structure and quality of these layers are low as the substrate and the insulating layer of the first wafer are removed. Furthermore, with selective removal of the substrate, the intermediate layer serves only as a stop layer, so that the thickness of the intermediate layer may also be, for example, less than 0.1 $\mu$m. The thermal load and stress from the oxidation are reduced to the greatest possible extent by the low demands upon the manufacturing process of the first wafer.

In a development of the method, it is advantageous if an oxide layer is created as an insulating layer on one of the two wafers as this only exerts low tensile and shear forces on the underlying substrate, in contrast to, for example, a nitride layer. In order to simplify the manufacturing process, it is also advantageous to produce the oxide layer exclusively on the surface of the first wafer, which in the case of thicker layers is preferably achieved by means of a deposition process.

In another development of the method, at least one characteristic parameter of the surface layer of the first wafer is changed before bonding the surfaces of the two wafers. In particular, the resistance of the first silicon layer of the first wafer can be changed by an implantation or precoating. Another possibility is to increase the thickness of the first layer, for example by means of an epitaxy process, and at the same time create a vertical gradient in the resistance of the first layer.

BRIEF DESCRIPTION OF THE FIGURES

The method according to the invention is described in the following by means of an embodiment in conjunction with a sequence of drawings. They show.

DESCRIPTION OF THE PREFERRED EMBODIMENTS

The sequence of process steps shown in FIGS. 1a–d illustrate the process for manufacturing a wafer 100 with an insulating intermediate layer of silicon oxide (SOI wafer). Such wafers are used, for example, as starting material for the manufacture of current-free substrate, integrated circuits. The manufacturing process is explained in detail in the following.

Figure 1A:
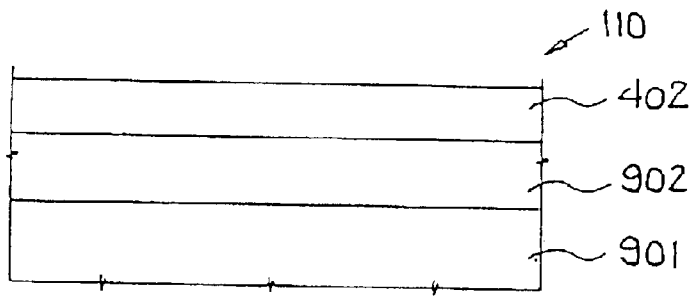
FIGS. 1a–d A diagrammatic sequence of a process for manufacturing a silicon wafer with an insulating intermediate layer.

FIG. 1a shows a cross-section of a first SOI wafer 110. The SOI wafer 110 has a silicon substrate 901 upon which is an oxide layer 902 as an insulating layer, the thickness of which preferably lies between 0.1 $\mu$m and 2.0 $\mu$m. There is a silicon layer 402 on top of the oxide layer 902.

Figure 1B:
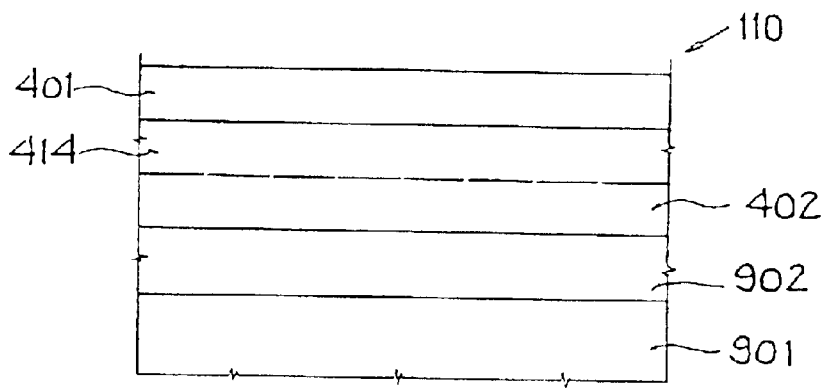
Figure 1C:
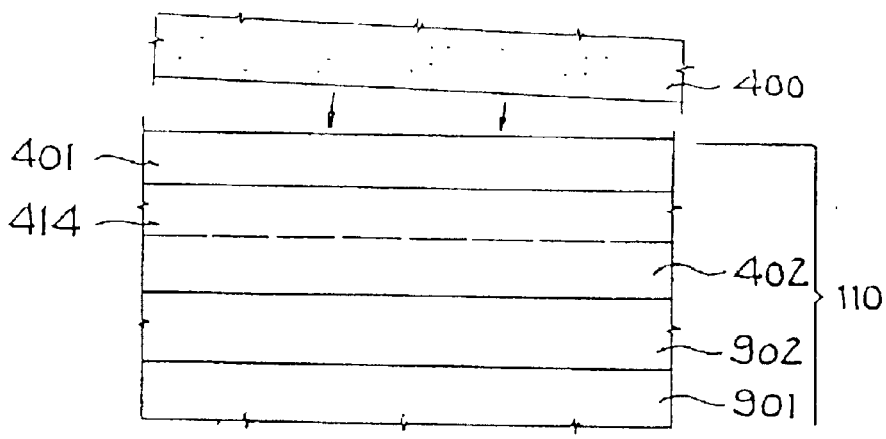

In a subsequent step shown in FIG. 1b, the thickness of the silicon layer 402 is increased by the thickness of a further silicon layer 414 by means of an epitaxy. The doping is successively changed during the epitaxy process in order to create a vertical doping profile within the silicon layer 414. An oxide layer 401 is then created, the thickness of which is determined by the subsequent use of the SOI wafer 100. In the case of thin oxide layers up to about 0.1 $\mu$m, it is advantageous to grow the oxide layer 401 through thermal means by an oxidation step, in which the thickness of the silicon layer 414 is correspondingly reduced. If thicker oxide layers are required, for example greater than 0.5 $\mu$m, it is advantageous after a first thin thermal oxide, to produce the remainder of the oxide layer by means of a deposition process. In a subsequent process step, shown in FIG. 1c, the surface of the SOI wafer 110 is bonded to the surface of a second wafer 400, which does not have an insulating oxide layer for reasons of cost. An important prerequisite for this is that the surfaces of the two wafers are to the greatest possible extent planar, i.e. neither concavely nor convexly warped.

Figure 1D:
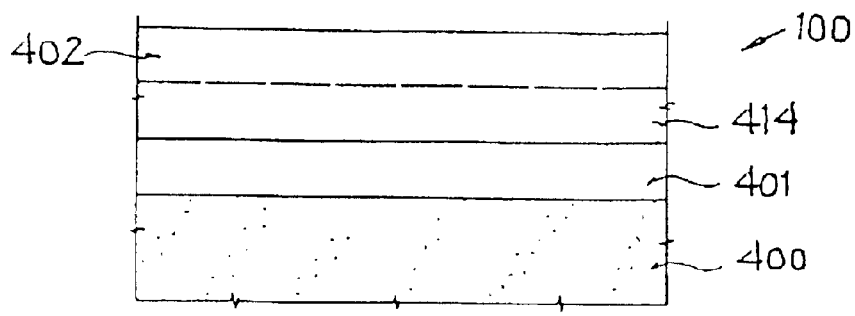

The cross-section of the finished SOI wafer 100 is shown in FIG. 1d, in which the substrate 901 and the oxide layer 902 of the original SOI wafer 110 have been removed. The substrate is preferably removed by a combination of a chemical mechanical polishing step and a wet chemical etching step, in which there is selectivity in the etching rate between silicon and oxide in the wet chemical process step.

With the method according to the invention, the clean and defect-free surface of the first wafer 110 is made available as the starting surface for subsequent manufacturing processes. Additional after-treatment steps in order to achieve an adequate surface quality are not required. Moreover, it is possible to specifically change the layer parameters of the silicon layer 402. Standard methods, such as for example implantation, epitaxy etc., can be used for this purpose. Moreover, it is also possible to create buried layers with the method according to the invention. In addition, instead of a single oxide layer 401, various layer structures, for example combinations of nitride, polysilicon and oxide layers, can be created, which then form the insulating intermediate layer. Furthermore, the method may also be used for silicon wafers which do not have an insulating intermediate layer.

What is claimed is:

1. A method of manufacturing a multi-layered wafer, comprising the steps:
    a) providing a first initial wafer (110) comprising silicon, and including a first substrate (901), a first insulating intermediate layer (902) on said first substrate, and a first surface layer (402) on said first insulating intermediate layer;
    b) providing a second initial wafer (400) comprising silicon, and including a second substrate;
    c) forming at least one insulating layer (401) on at least one of a silicon-containing exposed surface of said first initial wafer after said step a) and a silicon-containing exposed surface of said second initial wafer after said step b);
    d) after said step c), bonding together said first initial wafer and said second initial wafer along a new outer surface of said at least one insulating layer (401), wherein said bonding involves bonding an insulating material of one of said at least one insulating layer (401) onto said silicon of said second initial wafer (400), or onto said silicon of said first initial water (110), or onto an insulating material of another of said at least one insulating layer (401); and
    e) after said step d), removing said first substrate (901) of said first initial wafer (110), to leave said multi-layered wafer including at least a part of said second initial wafer, said at least one insulating layer (401), and said first surface layer (402).

2. The method according to claim 1, wherein said at least a part of said second initial wafer comprises said second substrate.

3. The method according to claim 1, wherein said step c) comprises forming only one said insulating layer (401) on only one said exposed surface of only one of said first initial wafer and said second initial wafer, and the other of said first and second initial wafers does not have an insulating layer on said exposed surface thereof.

4. The method according to claim 3, wherein said step c) comprises forming said insulating layer (401) on said exposed surface of said first initial wafer (110).

5. The method according to claim 4, wherein said forming of said insulating layer (401) comprises depositing an oxide by a deposition process to form said insulating layer of said oxide.

6. The method according to claim 4, wherein said bonding in said step d) comprises said bonding of said insulating material of said insulating layer (401) onto said silicon of said second initial wafer (400).

7. The method according to claim 3, wherein said step c) comprises forming said insulating layer (401) on said exposed surface of said second initial wafer (400), and wherein said bonding in said step d) comprises said bonding of said insulating material of said insulating layer (401) onto said silicon of said first initial wafer (110).

8. The method according to claim 1, wherein said step c) comprises forming a first one of said insulating layer on said exposed surface of said first initial wafer and a second one of said insulating layer on said exposed surface of said second initial wafer, and wherein said bonding in said step d) comprises said bonding of said insulating material of said first insulating layer onto said insulating material of said second insulating layer.

9. The method according to claim 1, wherein said removing in said step e) comprises selectively removing said first substrate (901) relative to said insulating intermediate layer (902).

10. The method according to claim 1, wherein said removing in said step e) further comprises removing said insulating intermediate layer (902).

11. The method according to claim 1, wherein said at least one insulating layer (401) formed in said step c) is at least one oxide layer.

12. The method according to claim 11, wherein said forming of said at least one oxide layer is carried out by depositing an oxide material.

13. The method according to claim 1, further comprising, before said step d), an additional step of changing at least one characteristic parameter of said first surface layer (402).

14. The method according to claim 13, wherein said at least one characteristic parameter includes a resistance of said first surface layer.

15. The method according to claim 13, wherein said at least one characteristic parameter includes a thickness of said first surface layer.

16. The method according to claim 1, wherein said first substrate, said first surface layer and said second substrate each respectively comprise silicon, and wherein said first insulating intermediate layer and said at least one insulating layer each respectively comprise an oxide.

17. The method according to claim 1, wherein said second initial wafer (400) consists of said second substrate which comprises said silicon, and does not include an insulating layer thereon.

18. The method according to claim 1, wherein each one of said first substrate, said first insulating intermediate layer, said first surface layer, said second substrate, and said at least one insulating layer is a respective uniform continuous layer.

19. The method according to claim 1, excluding a continuous metal layer extending across an entire sectional surface area of said multi-layered wafer.

20. The method according to claim 1, further comprising carrying out an epitaxial process to form a silicon layer (414) with a doping gradient in a layer thickness direction between said first surface layer (402) and said at least one insulating layer (401).

* * * * *